US010670468B2

(12) United States Patent
Kang et al.

(10) Patent No.: US 10,670,468 B2
(45) Date of Patent: Jun. 2, 2020

(54) INFRARED PIXEL STRUCTURE, MANUFACTURING METHOD THEREOF AND HYBRID IMAGE DEVICE

(71) Applicant: SHANGHAI IC R&D CENTER CO., LTD., Shanghai (CN)

(72) Inventors: Xiaoxu Kang, Shanghai (CN); Shoumian Chen, Shanghai (CN)

(73) Assignee: SHANGHAI R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 16/310,818

(22) PCT Filed: Nov. 7, 2016

(86) PCT No.: PCT/CN2016/098382
§ 371 (c)(1),
(2) Date: Dec. 18, 2018

(87) PCT Pub. No.: WO2018/014439
PCT Pub. Date: Jan. 25, 2018

(65) Prior Publication Data
US 2019/0178721 A1    Jun. 13, 2019

(30) Foreign Application Priority Data

Jul. 18, 2016  (CN) .......................... 2016 1 0564817

(51) Int. Cl.
*G01J 5/34* (2006.01)
*H01L 37/02* (2006.01)
*H04N 5/33* (2006.01)
*G01J 5/00* (2006.01)

(52) U.S. Cl.
CPC ................ *G01J 5/34* (2013.01); *H01L 37/02* (2013.01); *H04N 5/33* (2013.01); *G01J 2005/0077* (2013.01)

(58) Field of Classification Search
CPC ...... G01J 5/34; G01J 2005/0077; G01J 5/024; G01J 5/40; H01L 37/02; H04N 5/33
See application file for complete search history.

(56) References Cited

U.S. PATENT DOCUMENTS

| 5,095,215 A | * | 3/1992 | Shorrocks | G01J 5/10 250/338.1 |
| 6,049,080 A | * | 4/2000 | Ito | G01J 5/02 250/338.3 |
| 6,080,988 A | * | 6/2000 | Ishizuya | G01J 5/06 250/330 |

(Continued)

*Primary Examiner* — Christine S. Kim
(74) *Attorney, Agent, or Firm* — Tianchen LLC.; Yuan R. Li; Yi Fan Yin

(57) ABSTRACT

The present invention provides an infrared pixel structure and a hybrid imaging device which use comb-shaped top plates and bottom plates to form capacitors. The upper electrode has a non-fixed end such that the infrared sensitive element in the upper electrode generates thermal stress and deforms when absorbing the infrared light, which changes the capacitance of the capacitors formed by the top plates and the bottom plates to achieve infrared detection and increase the device sensitivity. Furthermore, the infrared pixel structure can be used in an infrared light and visible light hybrid imaging device to achieve visible light imaging and infrared imaging in a same silicon substrate, so as to increase the imaging quality.

17 Claims, 7 Drawing Sheets

(56) References Cited

U.S. PATENT DOCUMENTS

| | | | | |
|---|---|---|---|---|
| 6,573,504 B2* | 6/2003 | Iida | ............ | G01J 5/10 |
| | | | | 250/330 |
| 7,477,003 B2* | 1/2009 | Takayanagi | ............ | B81B 3/0072 |
| | | | | 310/330 |
| 8,047,710 B2* | 11/2011 | Ikushima | ............ | G01J 5/02 |
| | | | | 250/338.1 |
| 2009/0050808 A1* | 2/2009 | Ushimi | ............ | G01J 5/02 |
| | | | | 250/338.3 |
| 2017/0030768 A1* | 2/2017 | Dardona | ............ | G01J 1/02 |
| 2017/0241840 A1* | 8/2017 | Pocas | ............ | G01J 5/024 |
| 2018/0331155 A1* | 11/2018 | Leduc | ............ | H01L 27/16 |

\* cited by examiner

INFRARED PIXEL STRUCTURE, MANUFACTURING METHOD THEREOF AND HYBRID IMAGE DEVICE

CROSS-REFERENCE TO RELATED APPLICATION

This application claims the priority benefit of International Patent Application Serial No. PCT/CN2016/098382, filed Nov. 7, 2016, which is related to and claims the priority benefit of China patent application serial No. 201610564817.0, filed Jul. 18, 2016. The entirety of each of the above-mentioned patent applications is hereby incorporated by reference herein and made a part of this specification.

FIELD OF THE INVENTION

The present invention generally relates to the field of semiconductor technology, more particularly, to an infrared pixel structure and its manufacturing method, and a hybrid image device.

BACKGROUND OF THE INVENTION

With the wide application of the imaging monitoring system in daily life, the conventional monitoring system with an imaging device operating in 300 nm-900 nm visible spectrum is unable to satisfy the monitoring demand under a night environment or an environment with a high dynamic range. More and more applications require out-of-visible-band imaging especially long-wave band imaging (such as infrared band, THz band).

In the prior art, visible imaging and long-wave band imaging are achieved by two imaging chips for different wave bands and two individual optical systems, and then are composed through computer algorithms. However, the inconsistency of the optical paths and errors in individual imaging units may result in great bias of the composed image, which will severely affect the imaging quality and monitoring effect. Furthermore, the low sensitivity of such imaging device will also decrease the imaging performance.

BRIEF SUMMARY OF THE DISCLOSURE

Accordingly, an objective of the present invention is to provide an infrared pixel structure and its manufacturing method which utilize a variable capacitor structure to increase the imaging sensitivity and imaging quality. Another objective of the present invention is to provide a visible light and infrared light hybrid imaging device containing the above-mentioned infrared pixel structure which integrates visible-light detection and infrared-light detection in a same silicon substrate, so as to increase the hybrid imaging quality.

To achieve the above purposes, the present invention provides an infrared pixel structure formed on a silicon substrate, the infrared pixel structure comprises: a lower electrode disposed in the silicon substrate, the lower electrode comprises multiple bottom plates arranged in a first direction, and a bottom connector arranged in a second direction for connecting the bottom plates; an upper electrode disposed above the lower electrode, the upper electrode comprises multiple top plates arranged in the first direction and inter-arranged among the bottom plates, and a top connector arranged in the second direction for connecting the top plates; the top connector has a fixed end and a non-fixed end, the non-fixed end is capable of moving relative to the fixed end; an infrared-sensitive element provided on an upper surface of the top connector, for absorbing incident infrared light and producing thermal deformation to make the non-fixed end move relative to the fixed end and produce a relative displacement between the top plates and the bottom plates, so as to change capacitive signals of the top plates and the bottom plates to achieve infrared detection.

Preferably, the bottom connector is connected to a lead end of the lower electrode; the fixed end is a connecting end which is connected to a lead end of the upper electrode, the non-fixed end is a non-connecting end which is movable relative to the connecting end; the top connector is connected to the lead end of the upper electrode through a piezoresistor.

Preferably, the piezoresistor has a planar zigzag configuration.

Preferably, the infrared pixel structure further comprises a cantilever; one end of the piezoresistor is connected to the connecting end of the top connector, the other end of the piezoresistor is connected to an end of the cantilever; the other end of the cantilever is connected to the lead end of the upper electrode.

Preferably, a horizontal projection of the cantilever is L-shaped.

Preferably, the infrared sensitive element has a material sensitive to micro stress; an increase of the micro stress occurred during a temperature rise or temperature decrease period leads to a deformation of the infrared sensitive element, which makes the top connector move relative to the connecting end and cause the relative displacement between the top plates and the bottom plates.

Preferably, the bottom connector is connected to a bottom surface of each of the bottom plates to form multiple grooves by each two adjacent bottom plates and the bottom connector; each of the top plates is inserted into one of the grooves; for each of the grooves, two bottom plates forming the groove, the top plate inserted into the groove and an air gap within the groove form a dual-capacitor structure.

Preferably, a dielectric layer is formed on a sidewall surface of each of the bottom plates which approaches the adjacent top plate when the top plates move relative to the bottom plates.

To achieve the above purposes, the present invention also provides a hybrid imaging device which comprises the above-mentioned infrared pixel structure on an upper surface of the silicon substrate and a visible light pixel structure formed on a bottom surface of the silicon substrate below the infrared pixel structure.

To achieve the above purposes, the present invention also provides a manufacturing method for the above-mentioned infrared pixel structure, comprising the following steps:

S01, forming a lower electrode region in a silicon substrate;

S02, etching to form multiple grooves in the lower electrode region, wherein a portion of the lower electrode region at sidewalls of the grooves form multiple bottom plates, a portion of the lower electrode region at bottoms of the grooves form a bottom connector;

S03: forming a sacrificial layer on the silicon substrate;

S04: forming top plates in the sacrificial layer within the grooves, then forming a top connector connected to the top plates on a surface of the sacrificial layer;

S05: forming an infrared sensitive structure on a surface of the top connector;

S06: removing the sacrificial layer by a releasing process.

The infrared pixel structure of the present invention utilizes comb-shaped top plates and bottom plates to form capacitors. Especially, the upper electrode has a non-fixed end such that the infrared sensitive element in the upper electrode generates thermal stress and deforms when absorbing the infrared light, which changes the capacitance of the capacitors formed by the top plates and the bottom plates to achieve infrared detection and increase the device sensitivity. Furthermore, the infrared pixel structure can be used in an infrared light and visible light hybrid imaging device to achieve visible light imaging and infrared imaging in a same silicon substrate, so as to increase the imaging quality.

DETAILED DESCRIPTION OF THE EMBODIMENTS

The present invention will now be described more fully hereinafter with reference to the accompanying drawings. It will be understood that various changes in form and details may be made herein without departing from the spirit and scope of the invention; and the embodiments and drawings are substantially used for illustrating the invention and should not be used as limitation to the present invention.

The infrared pixel structure according to the present invention comprises an upper electrode having a fixed end and a non-fixed end, and a lower electrode. The top plates of the upper electrode and the bottom plates of the lower electrode are inter-arranged. The upper electrode comprises an infrared-sensitive element which generates thermal deformation when absorbing the infrared light and performs position displacement relative to the lower electrode, which changes the capacitive signals between the upper electrode and the lower electrode, so as to achieve infrared detection.

The present invention will now be described more fully hereinafter with reference to FIG. 1-FIG. 16. It should be noted that the drawings are not necessarily to scale, emphasis instead being placed upon illustrating the principles of the present invention.

Figure 1:
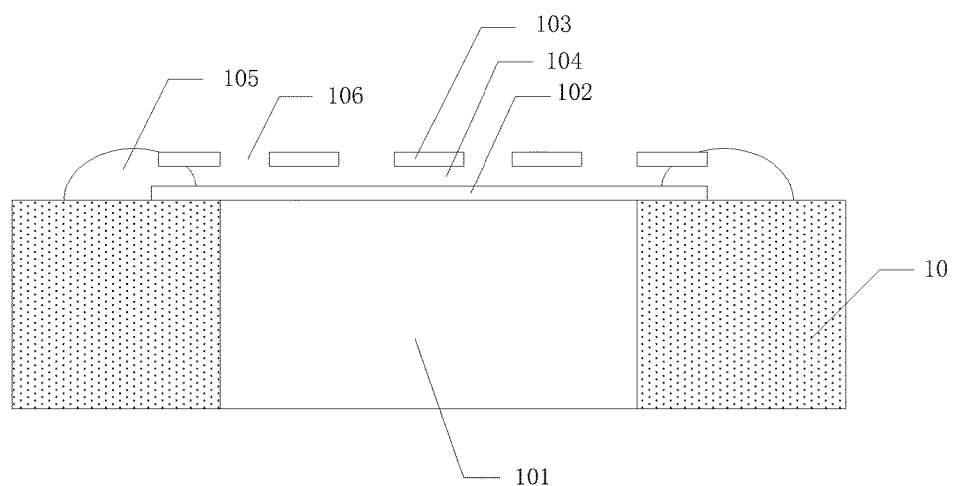
FIG. 1 is a top view of an infrared pixel structure according to a preferred embodiment of the present invention.
Figure 2:
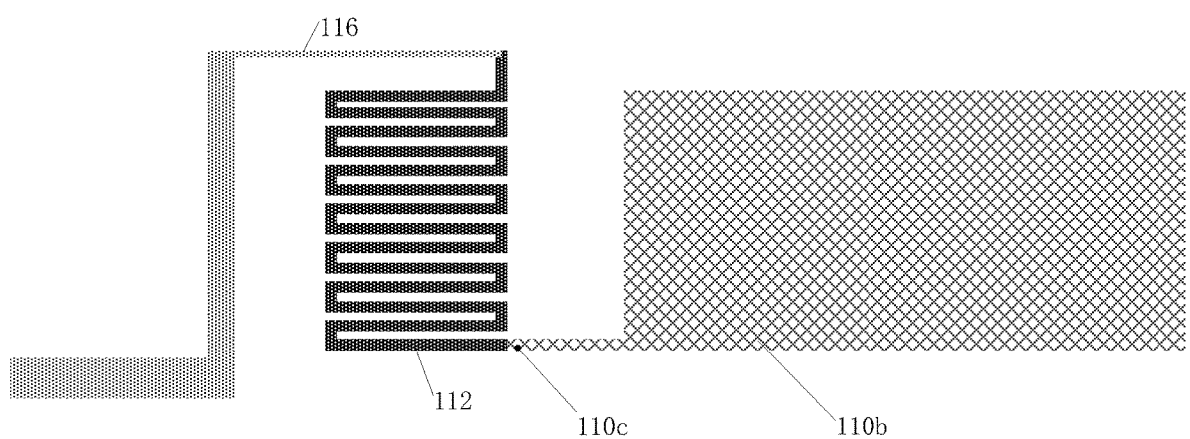
FIG. 2 is a front sectional view of the infrared pixel structure in FIG. 1.

Referring to FIG. 1 and FIG. 2, in the embodiment, the infrared pixel structure is disposed on a silicon substrate 100. The infrared pixel structure comprises:

a lower electrode in the silicon substrate 100. The lower electrode comprises bottom plates 106a which are arranged in a first direction, and a bottom connector 106b arranged in a second direction which connects the bottom plates 106a. The bottom connector 106b is connected to a lead end of the lower electrode (in the embodiment, the lead end comprises a via contact 105 and a pad 108b). In the embodiment, the bottom connector 106b has a bottom connecting end 106b1 which connects the lead end of the lower electrode. The bottom connecting end 106b1 is higher than a horizontal portion of the bottom connector 106b. The lead end of the lower electrode is composed of the via contact 105 and the pad 108b. The via contact 105 penetrates through the bottom connecting end 106b1. The via contact 105 is connected to the pad 108b at its top end. The pad 108b directly contacts the bottom connecting end 106b1.

The upper electrode disposed above the lower electrode comprises multiple top plates 110a which are arranged in the first direction and inter-arranged among the bottom plates, and a top connector 110b arranged in the second direction which connects the top plates 110a. The top connector 110b has a connecting end 110c which is connected to a lead end of the upper electrode and a non-connecting end which is not fixed, such that the non-connecting end is movable relative to the connecting end. The top connector may have a rectangular configuration. Herein, the top connector 110b is connected to the lead end of the upper electrode through a piezoresistor 112. The piezoresistor has a planar zigzag configuration, that is, a snake-like configuration, which increases the resistivity. One end of the piezoresistor 112 is connected to the connecting end 110c of the top connector 110b, e.g. by a metallic wiring. The other end of the piezoresistor is connected to an end of a cantilever 116. Accordingly, a capacitor and resistor structure is formed to output RC signal. The other end of the cantilever 116 is connected to the lead end of the upper electrode. The horizontal projection of the cantilever is L-shaped, as shown in FIG. 1. In the embodiment, the lead end of the upper electrode is composed of a via contact 108 and a pad 108a. The pad 108a is connected to the cantilever 116, the via contact 108 is connected to the pad 108a. The via contact 108 penetrates through the silicon substrate 100. The pad 108a is isolated from the silicon substrate 100 by at least one insulating layer. For example, the insulating layer may comprise a buffer dielectric layer 107a made of a material like $SiO_2$ and a barrier layer 107b made of a material like SiN. Preferably, the top plates 110a and the top connector 106b can be made of a metallic material which absorbs the infrared light, like TiN or TaN. Accordingly, the top plates 110a and the top connector 110b can absorb and transmit heat to the infrared-sensitive element, which not only increases the utilization of the infrared light, but also enhances the sensitivity of the infrared-sensitive element.

Herein, the first direction is perpendicular to the second direction. The first direction is a vertical direction, while the second direction is a horizontal direction. The bottom connector 106b connects the bottoms of the bottom plates 106a, such that each two adjacent bottom plates and the portion of the bottom connector therebetween form a groove. Each top plate 110a is inserted into a groove. For each groove, two bottom plates forming the groove, the top plate inserted into the groove and an air gap within the groove form a dual-capacitor structure. Preferably, the depth-to-width ratio of the groove is greater than 3, the width-to-space ratio of the groove is greater than 3. Herein, the width-to-space ratio is a ratio of the width of the groove and a space between two adjacent grooves.

An infrared-sensitive element is provided on the top connector 110b for absorbing the incident infrared light and generating thermal deformation, such that the non-connecting end moves relative to the connecting end 110c, and the top plates 110a move relative to the bottom plates 110b. Accordingly, the capacitive signals generated by the dual capacitor structures are varied, so as to achieve infrared detection. Herein, the infrared-sensitive element has a material sensitive to micro stress. An increase of the micro stress occurred during a temperature rise or temperature decrease period leads to a deformation of the whole infrared-sensitive element, in macroscopic view, and makes the top connector move relative to the connecting end, and causes the relative displacement between the top plates and the bottom plates. In the embodiment, the infrared-sensitive element at least comprises an infrared light absorbing layer 113 and a material layer 114 on the surface of the infrared light absorbing layer 113. The infrared light absorbing layer 113 at least locates at the top or the bottom of the infrared-sensitive element. The material layer 114 has a different coefficient of thermal expansion than the infrared light absorbing layer 113. The infrared light absorbing layer 113 produces and transmits heat to the material layer 114, the material layer 114 absorbs the heat. The thermal expansion coefficient mismatch between the infrared light absorbing layer 113 and the material layer 114 causes stress and deformation, such that the top connector 110b moves relative to the connecting end 110c, the top plates 110a and the bottom plates 110b have a relative displacement. Preferably, the material layer 114 is a thermal deformation layer whose coefficient of thermal expansion is greater than the coefficient of thermal expansion of the infrared light absorbing layer 113. Specifically, the infrared-sensitive element comprises the infrared light absorbing layer 113 and the thermal deformation layer 114 on the infrared light absorbing layer 113. The infrared light absorbing layer 113 produces and transmits heat to the thermal deformation layer 114, which expands the thermal deformation layer 114 and generates stress between the thermal deformation layer 114 and the infrared light absorbing layer 113, thereby causing an upwarp deformation of the thermal deformation layer 114 and the infrared light absorbing layer 113. As a result, the top connector 110b moves upward relative to the connecting end 110c, such that the top plates 110a and the bottom plates 106a have the relative displacement. Preferably, the infrared light absorbing layer can be made of a material that absorbs the infrared light, like SiN, SiON, etc. The thermal deformation layer 114 can be made of a material having a high coefficient of thermal expansion, like $ZrO_2$, SiC, $Al_2O_3$, etc.

In the embodiment, the lower surface of the top connector 110b is covered by a lower dielectric protection layer 111, the surfaces of the cantilever 116, the piezoresistor 112 and the infrared-sensitive element are covered by an upper dielectric protection layer 115. Preferably, the lower dielectric protection layer 111 and the upper dielectric protection layer 115 can be made of SiN or silicon-rich SiN.

Figure 3:
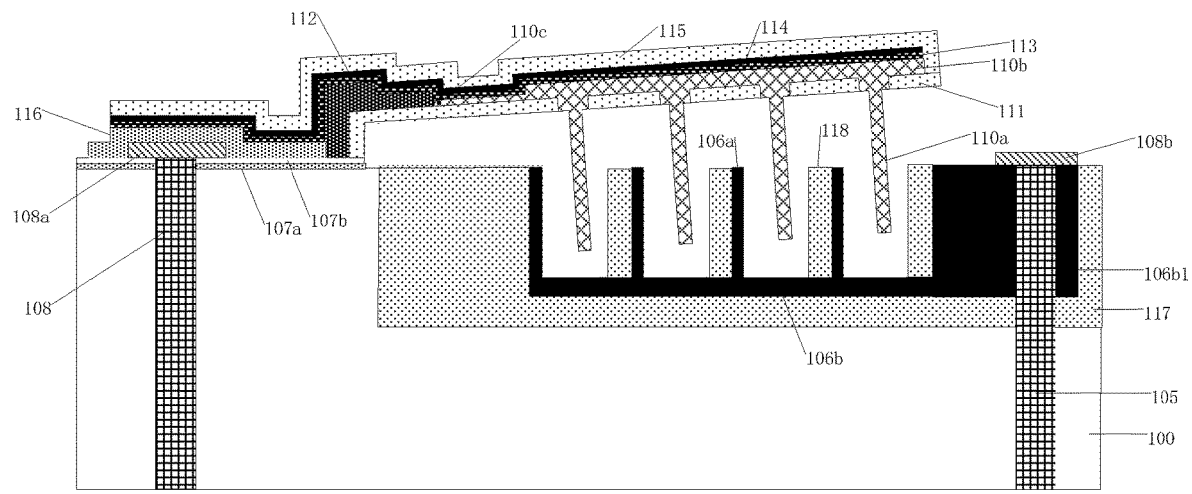
FIG. 3 is a view showing the upper electrode of the infrared pixel structure in FIG. 2 moving relative to the lower electrode.

A dielectric layer 118 is formed on a sidewall surface of each bottom plate 106a which approaches the adjacent top plate 110a when the top plates 110a move relative to the bottom plates 106a. During the relative motion of the top plates 110a and the bottom plates 106a, the dielectric layers 118 prevent opposite variations of the capacitive signals, so as to ensure consistent capacitance variations between the top plates 110a and the bottom plates 106a, which is beneficial to signal enhancement. As shown in FIG. 3, when the top plates 110a move upward, the overlap area of each pair of a top plate 110a and a bottom plate 106a decreases, the capacitance between the top plate 110a and the bottom plate 106a is also reduced. Accordingly, the capacitance of the dual capacitor structure formed by one top plate 110a and its adjacent two bottom plates 106a is reduced. On the other hand, the increase of the distance from the top plate 110a to the bottom plates 106a at its left side decreases the capacitance therebetween, while the decrease of the distance from the top plate 110a to the bottom plates 106a at its right side increases the capacitance therebetween. As a result, the capacitance degradation of the capacitor structure at the left side is intensified, while the capacitance degradation of the capacitor structure at the right side is weakened. Since the signal enhancement of the capacitance degradation is beneficial to the detection sensitivity, while the signal attenuation of the capacitance degradation is negative to the detection sensitivity, it is preferred that the signal of the capacitance degradation is increased without any interreference. Herein, "the decrease of the distance from the top plate 110a to the bottom plates 106a at its right side" is the interreference. The dielectric layer 118 on a sidewall surface of the bottom plate 106a at the right side of the top plate 110a weakens the capacitance signal of the capacitive structure at the right side, that is, removes the interreference. In the embodiment, the silicon substrate 100 has a doped region 117, the lower electrode is formed in the doped region 117. The doping type of the lower electrode is opposite to the doping type of the doped region 117. The doping type of the dielectric layer 118 is opposite to the doping type of the lower electrode. Accordingly, the capacitive structure formed by the top plate 110a and the bottom plate 106a has the characteristic of forward conducting and backward non-conducting. For example, the doped region is doped by N-type dopants, like As/P, the lower electrode is P-type doped, the dielectric layer is N-type doped.

In the embodiment, the bottom plates 106a are made of a material capable of receiving the infrared light, such that the infrared light introducing from the bottom of the silicon substrate 100 can pass through the bottom plates 106a and enter into the infrared-sensitive element. The infrared absorbing layer 113 absorbs the infrared light and produces heat, and transmits the heat to the thermal deformation layer 114, the piezoresistor 112 and the cantilever 116. The thermal stress is generated as the thermal deformation layer 114 heats up, and causes the deformation of the infrared-sensitive element composed by the thermal deformation layer 114 and the infrared-light absorbing layer 113, which drives the top connector 110b and the top plates 110a to move upward. Accordingly, the distance between each top plate 110a and its adjacent bottom plate 106a varies. Specifically, the distance between the top plate 110a and the bottom plate 106a adjacent to the top plate 110a at the left sided increases, the piezoresistance decreases, and the RC signal reduces. The variation of the RC signal can be monitored by a standard CMOS resonance circuit. For an infrared image sensor having the infrared pixel structure, the RC signal can be used to form the infrared image at the desired waveband.

Figure 4:
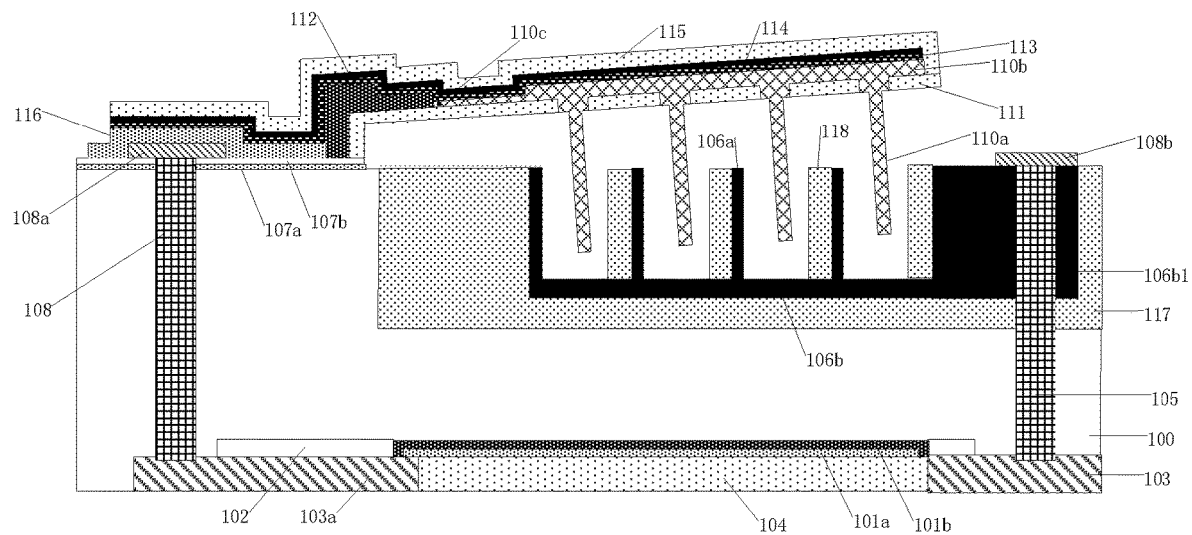
FIG. 4 is a structural view of a hybrid imaging device containing the infrared pixel structure in FIG. 2.

In the embodiment, a hybrid imaging device is also provided. As shown in FIG. 4, the arrow represents the incident direction of the light. The same silicon substrate 100 is provided with the above-mentioned infrared pixel structure on its upper surface and a visible light pixel structure on its lower surface. Specifically, a visible light detection region is provided on the lower surface of the silicon substrate 100. The silicon substrate is P-type doped, the visible light pixel structure in the lower surface of the silicon substrate 100 comprises a P-type region 101a and an N-type region 101b which form a PN junction. The P-type region 101a is surrounded by the N-type region 101b and is isolated form the P-type silicon substrate 100 by the N-type region 101b. A circuit module 102 formed by FEOL and BEOL processes is disposed at the periphery of the N-type region 101b without connecting the N-type region 101b. A BEOL structure 103 is disposed in the lower surface of the silicon substrate at the periphery of the N-type region 101b. The BEOL structure 103 is connected with the circuit module 102. An edge portion of the BEOL structure is extended to beneath the P-type region 101a and the N-type region 101b to be electrically connected to the P-type region 101a and the N-type region 101b. Accordingly, the BEOL structure 103 transmits the signal from the P-type region 101a and the N-type region 101b, that is, the light signal detected by the PN junction, to the circuit module 102. A light intensifying dielectric 104 is formed below the P-type region 101a, which can be made of an organic material to enhance light transmission.

The infrared pixel structure is disposed on the upper surface of the silicon substrate 100 above the PN junction of the visible light pixel structure. Especially, the N-type region 101b and the P-type region 101a are formed below the top plates 110a and the bottom plates 106a. The contact via 108 and the pad 108a form the lead end of the upper electrode. The contact via 108 penetrates the whole silicon substrate 100 and is connected to the BEOL structure 103 at its bottom. The contact via 108 is connected to the cantilever 113 at its top through the pad 108a. The pad 108b and the contact via 105 form the lead end of the lower electrode. The contact via 105 penetrates the whole silicon substrate 100 and is connected to the BEOL structure 103 at its bottom. The contact via 105 is connected to the bottom connector 106b at its top through the pad 108b. The contact vias 105, 108 can be made of multi-level layers. For example, the contact vias 105, 108 may have a SiO$_2$ insulating layer on their sidewall surfaces and Cu embedded therein surrounded by the SiO$_2$ insulating layer. The doped region 117 can isolate the lower electrode from the silicon substrate 100.

Figure 5:
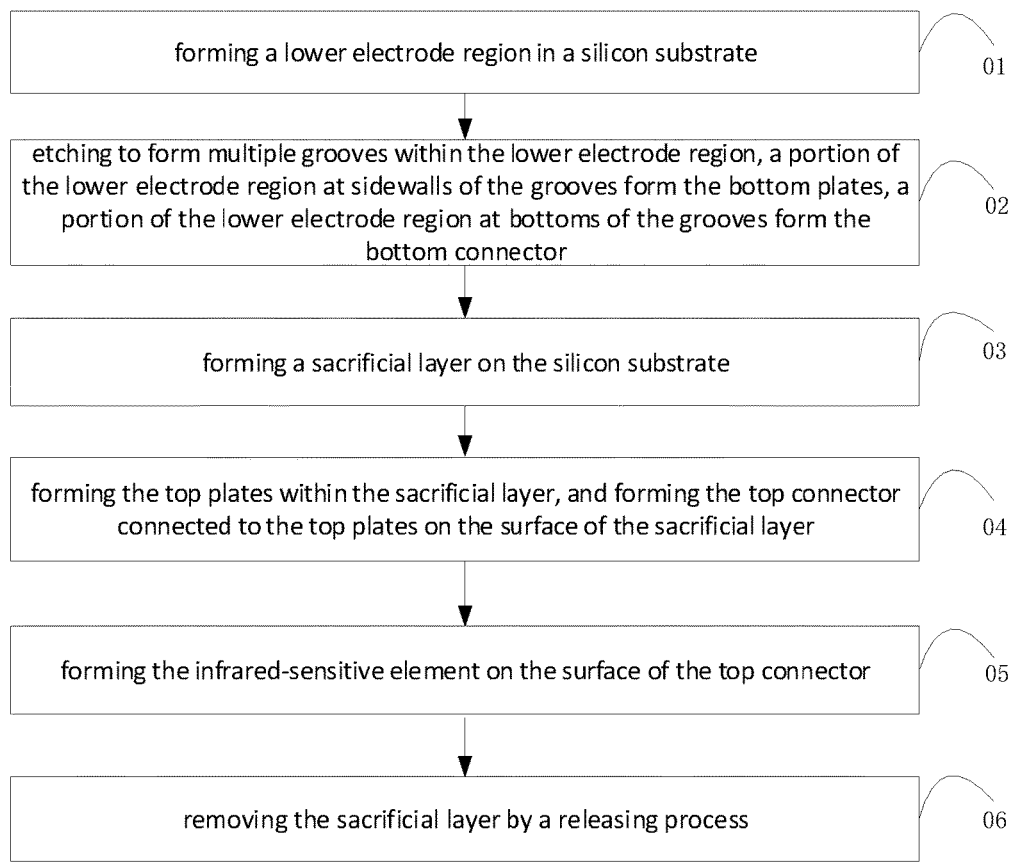
FIG. 5 is a flow chart of the manufacturing method for the infrared pixel structure according to a preferred embodiment of the present invention.

As shown in FIG. 5, the present invention also provides a manufacturing method for the infrared pixel structure, the method comprises the following steps:

S01, forming a lower electrode region in a silicon substrate.

Figure 6:
FIG. 6-FIG. 16 are views showing specific processing steps of the manufacturing method for the infrared pixel structure according to a preferred embodiment of the present invention.

Specifically, as shown in FIG. 6, ions of a first type are implanted into the silicon substrate 100 to form a doped region 117. In the embodiment, the doped region 117 is N-type doped. Then, ions of a second type are implanted into the doped region 117 to form the lower electrode region 106. The lower electrode region is P-type doped. The first type is opposite to the second type.

S02, etching to form multiple grooves within the lower electrode region, a portion of the lower electrode region at sidewalls of the grooves form the bottom plates, a portion of the lower electrode region at bottoms of the grooves form the bottom connector.

Figure 7:
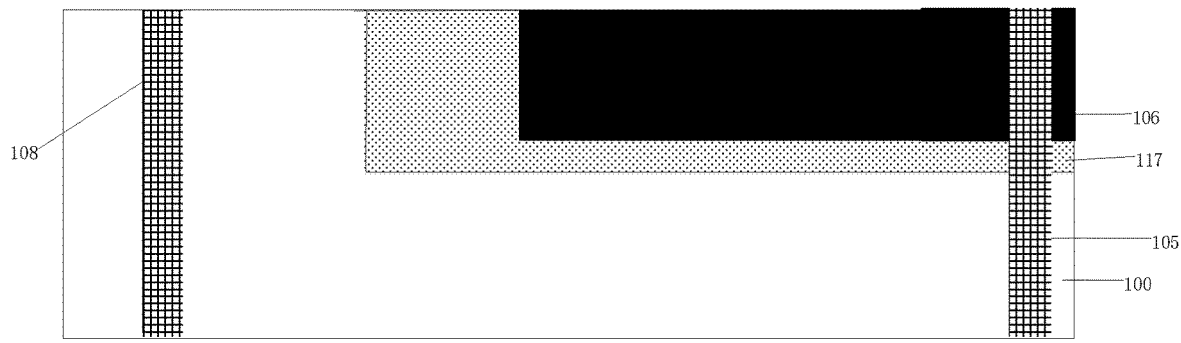
Figure 8:
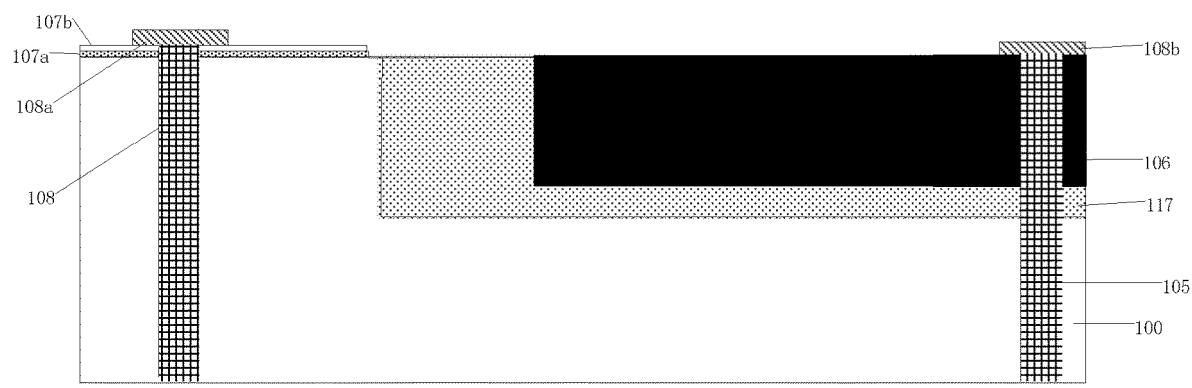
Figure 9:
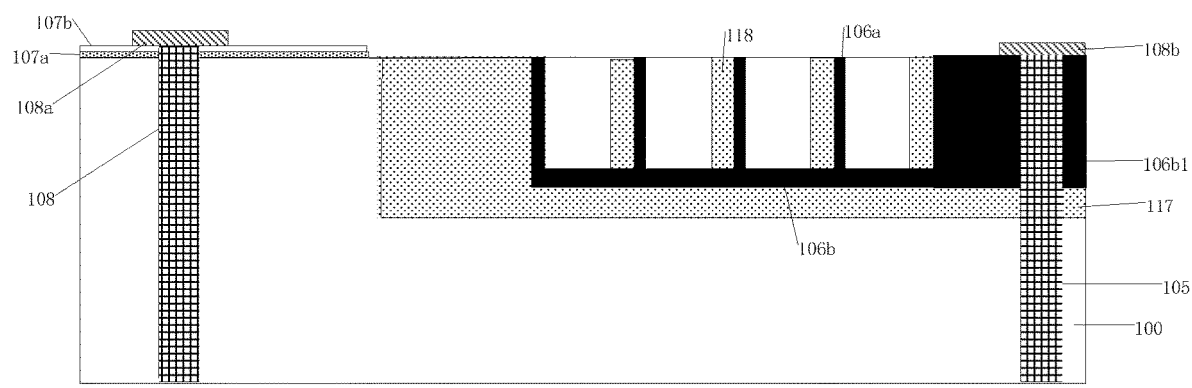

Specifically, as shown in FIG. 7, etching a pattern of the contact via 105 at a position corresponding to the bottom connecting end of the bottom connector and etching a pattern of the contact via 108 at the other side of the lower electrode region. The contact via 105 and the contact 108 penetrate through the silicon substrate 100. Then, depositing an insulating layer and a conductive metal successively, planarizing the top surfaces of the patterns of the contact vias 105, 108 so as to form the contact vias 105, 108. As shown in FIG. 8, forming an insulating layer on the contact via 108 through depositing and patterning an insulating material. The insulating layer comprises a barrier layer 107a and a buffer layer 107b. Forming pads 108b, 108a on the top of the contact vias 105, 108. After that, as shown in FIG. 9, performing lithography and etching processes to form multiple grooves within the lower electrode region. The sidewalls of the grooves form the bottom plates 106a, the bottoms of the grooves form the bottom connector 106b. The surface of each groove can be covered by a material layer (not shown) for selectively receiving the light of the required wavelengths. Furthermore, a dielectric layer 118 is deposited on a sidewall surface of each groove at one side. The dielectric layer 118 on the top surface of the grooves is removed through CMP. Herein, "one side" is a side of the bottom plate 106a which approaches the adjacent top plate 110a when the top plates 110a move relative to the bottom plates 106a.

S03, forming a sacrificial layer on the silicon substrate.

Figure 10:
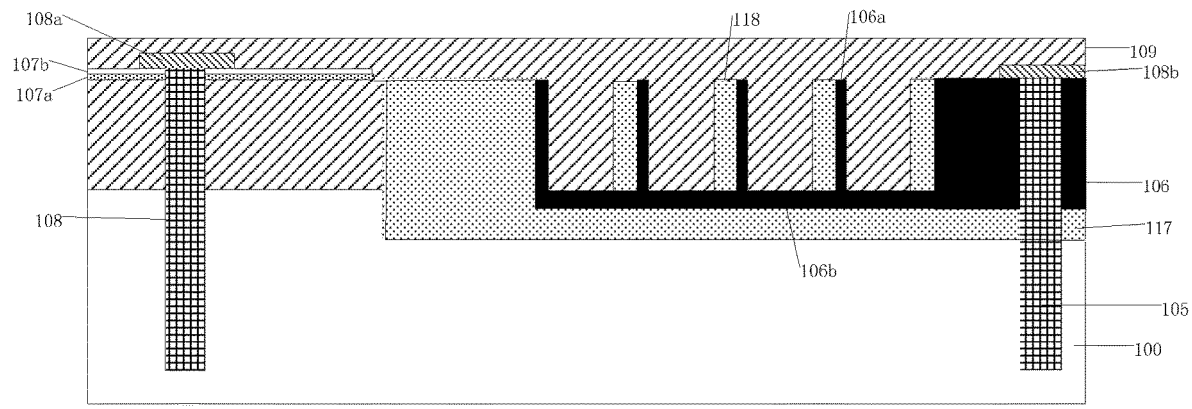

Specifically, as shown in FIG. 10, a sacrificial layer 109 is formed on the silicon substrate 100. The sacrificial layer 109 can be made of SiO$_2$, which is not limited thereto. The sacrificial layer 109 can be removed through HF steam in the subsequent steps.

S04, forming the top plates within the sacrificial layer, and forming the top connector connected to the top plates on the surface of the sacrificial layer.

Figure 11:
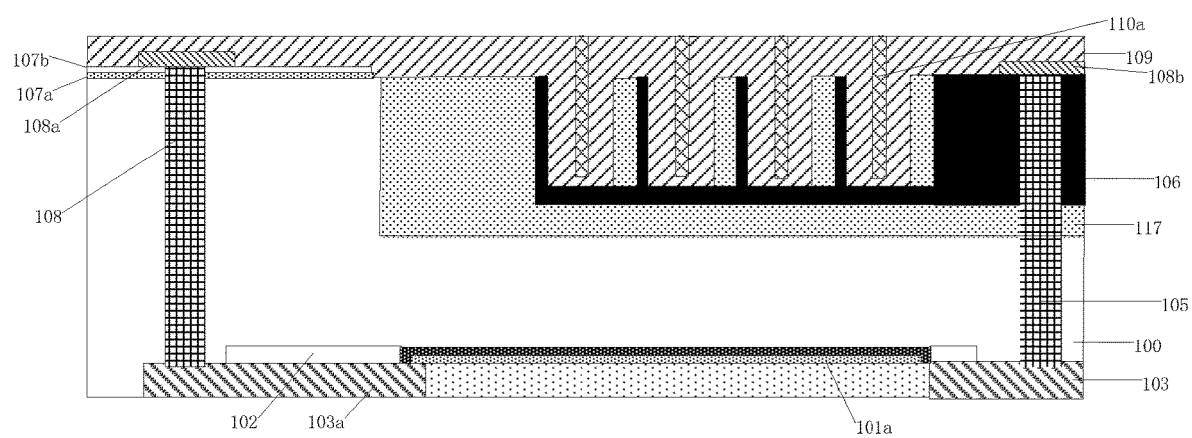
Figure 12:
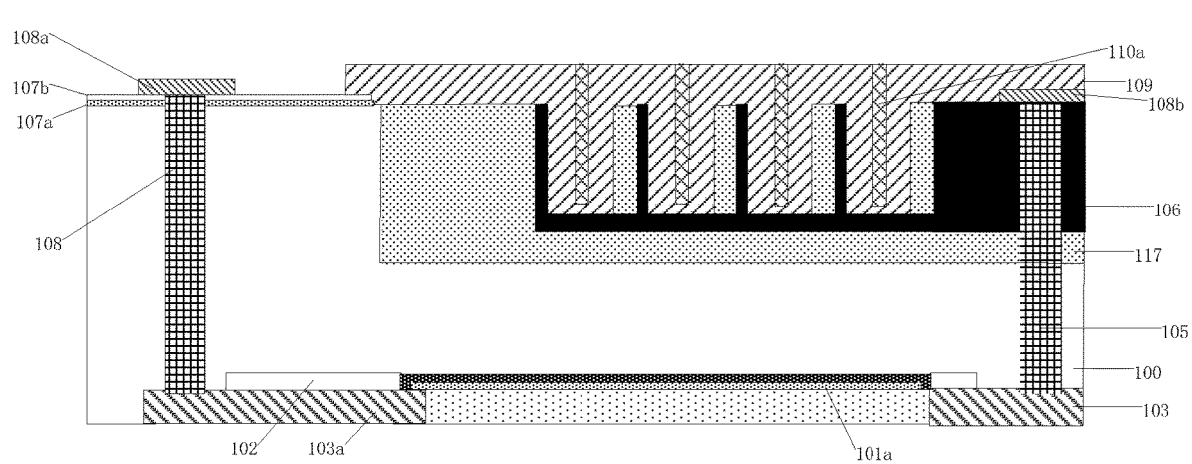
Figure 13:
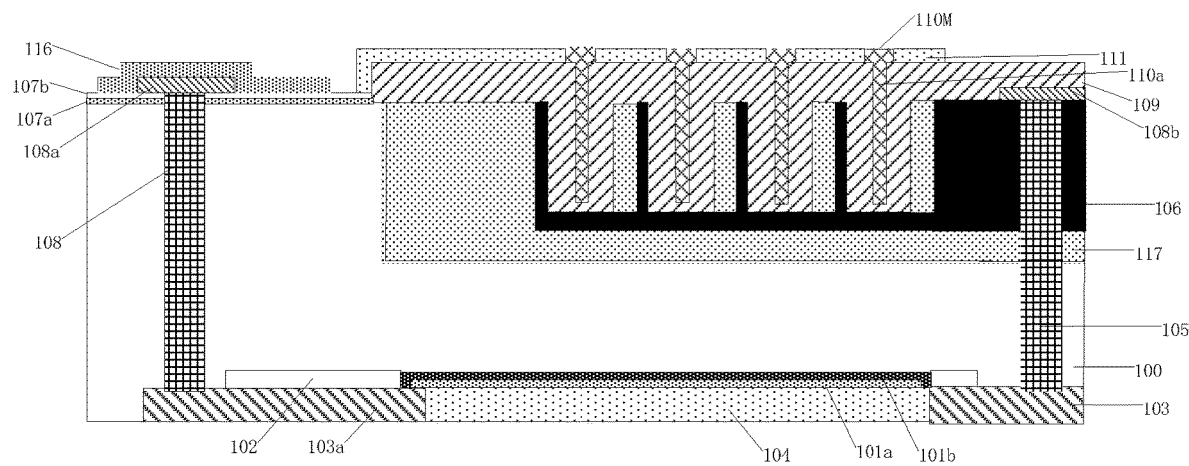
Figure 14:
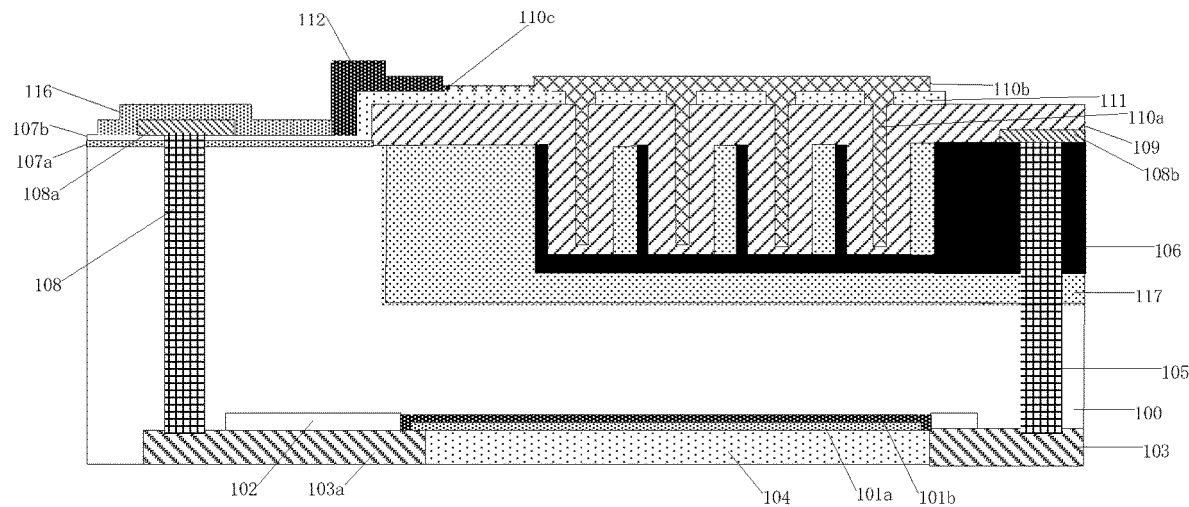

Specifically, as shown in FIG. 11, a pattern of the top plates 110a is formed through lithography and etching processes. The depth of the pattern of the top plates is less than the depth of the grooves. Then, the upper electrode material is deposited in the pattern of the top plates and is planarized though CMP such that the upper electrode material outside the pattern of the top plates is removed. Then, as shown in FIG. 12, patterning to remove the sacrificial layer 109 outside the lower electrode region. After that, as shown in FIG. 13, depositing a lower dielectric protection layer 111 on the exposed surfaces of the silicon substrate 100, the pad 108a, the buffer layer 107b, and the sacrificial layer 109. Etching the lower dielectric protection layer to from recesses that expose the top plates 110a. Depositing a material as same as the top plates in the recesses to form metal connecting structures 110M. As shown in FIG. 14, forming the top connector 110b on the surfaces of the lower dielectric protection layer 111 and the metal connecting structures 110M. After forming the top connector 110b, the piezoresistor 112 and the cantilever 116 can be formed at one side of the top connector 110b. The piezoresistor 112 is connected to the top connector 110b through a connecting end 110c of the top connector 110b. One end of the cantilever 116 is connected to the pad 108a, the other end is connected to the piezoresistor 112. The details of the piezoresistor 112 and the cantilever 116 have been described as previously mentioned, which is omitted herein.

It is noted that, in other embodiments of the present invention, the leading end of the lower electrode and the lead end of the upper electrode can be respectively formed in step S02 and S04. In step S04, the lead end of the upper electrode is formed in the exposed surface of the silicon substrate 100 after patterning the sacrificial layer 109 and removing the sacrificial layer 109 outside the lower electrode.

S05, forming the infrared-sensitive element on the surface of the top connector.

Figure 15:
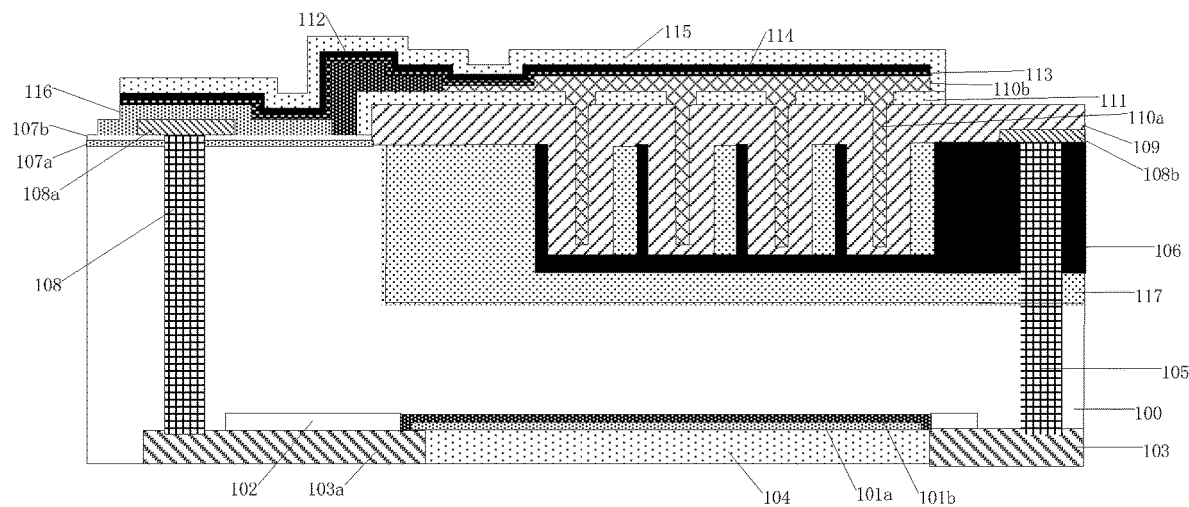

Specifically, as shown in FIG. 15, the infrared-sensitive element can be formed not only on the surface of the top connector, but also on the surfaces of the piezoresistor 112 and the cantilever 116. Herein, the infrared-sensitive element is a multi-layer structure comprising an infrared light absorbing layer 113, a thermal deformation layer 114, and an upper dielectric protection layer 115 which are formed in sequence.

S06, removing the sacrificial layer by a releasing process.

Figure 16:
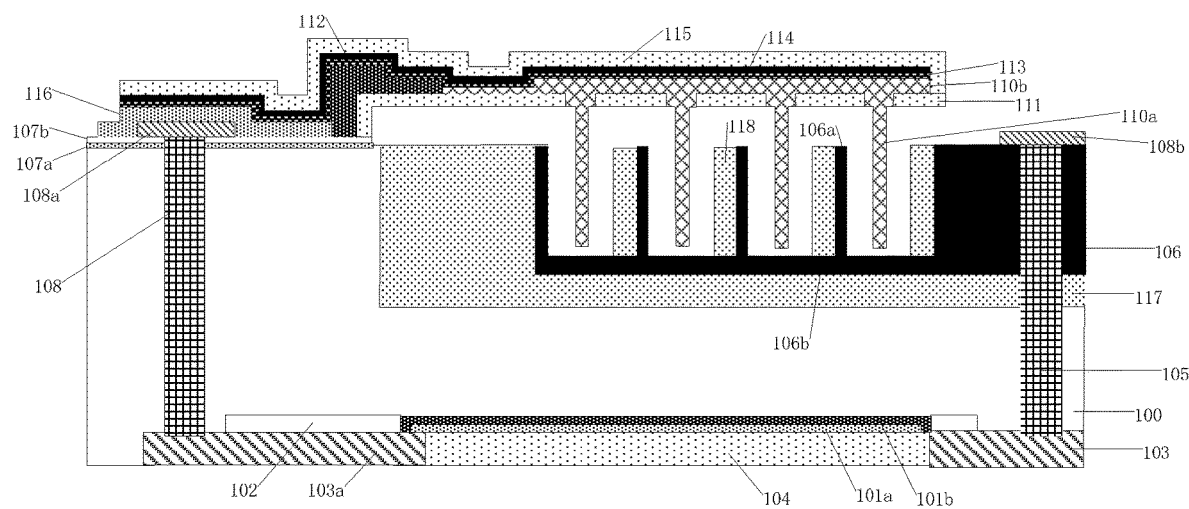

Specifically, as shown in FIG. 16, the infrared pixel structure is formed after removing the sacrificial layer. The incident light first incident into the visible light pixel structure, then enters into the lower electrode, the upper electrode, the infrared absorbing layer and the thermal deformation layer.

The manufacturing method of the hybrid imaging device of the embodiment comprises the steps of forming a visible light pixel structure on the lower surface of the silicon substrate 100, and forming the infrared pixel structure on the upper surface of the silicon substrate 100. The steps of forming the infrared pixel structure can refer the above steps S01-S05. Now please refer to FIG. 16, the steps of forming the visible light pixel structure comprises:

S001, forming an N-type region 101b in the lower surface of the silicon substrate 100. The N-type region 101b can be formed by ion implanting N-typed dopants.

S002, forming a P-type region 101a within the N-type region 101b. The N-type region 101b surrounds the P-type region 101a to form the PN junction.

S003, forming the circuit module 102 at the periphery of the PN junction.

S004, forming the BEOL structure 103 below the circuit module 102. Wherein, the BEOL structure 103 at one side below the PN junction is connected to the P-type region 101a within the N-type region 101b, so as to transmit the PN junction signal to the circuit module 102.

S005, depositing a light intensifying dielectric 104 between the BEOL structure.

The contact via 108 connected to the upper electrode and the contact via 106 connected to the lower electrode are respectively connected to the BEOL structure 103 at their bottoms. The specific structures of the visible light pixel structure and the infrared pixel structures can refer to the details as previously mentioned, which is omitted herein.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. An infrared pixel structure formed on a silicon substrate, the infrared pixel structure comprises:
   a lower electrode disposed in the silicon substrate, the lower electrode comprises multiple bottom plates arranged in a first direction, and a bottom connector arranged in a second direction for connecting the bottom plates;
   an upper electrode disposed above the lower electrode, the upper electrode comprises multiple top plates arranged in the first direction and inter-arranged among the bottom plates, and a top connector arranged in the second direction for connecting the top plates; the top connector has a fixed end and a non-fixed end, the non-fixed end is capable of moving relative to the fixed end;
   an infrared-sensitive element provided on an upper surface of the top connector, for absorbing incident infrared light and producing thermal deformation to make the non-fixed end move relative to the fixed end and produce a relative displacement between the top plates and the bottom plates, so as to change capacitive signals of the top plates and the bottom plates to achieve infrared detection.

2. The infrared pixel structure according to claim 1, wherein the bottom connector is connected to a lead end of the lower electrode; the fixed end is a connecting end which is connected to a lead end of the upper electrode, the non-fixed end is a non-connecting end which is movable relative to the connecting end; the top connector is connected to the lead end of the upper electrode through a piezoresistor.

3. The infrared pixel structure according to claim 2, wherein the piezoresistor has a planar zigzag configuration.

4. The infrared pixel structure according to claim 2, wherein the infrared pixel structure further comprises a cantilever; one end of the piezoresistor is connected to the connecting end of the top connector, the other end of the piezoresistor is connected to an end of the cantilever; the other end of the cantilever is connected to the lead end of the upper electrode.

5. The infrared pixel structure according to claim 4, wherein a horizontal projection of the cantilever is L-shaped.

6. The infrared pixel structure according to claim 1, wherein the infrared sensitive element has a material sensitive to micro stress; an increase of the micro stress occurred during a temperature rise or temperature decrease period leads to a deformation of the infrared sensitive element, which makes the top connector move relative to the connecting end and cause the relative displacement between the top plates and the bottom plates.

7. The infrared pixel structure according to claim 1, wherein the bottom connector is connected to a bottom surface of each of the bottom plates to form multiple grooves by each two adjacent bottom plates and the bottom connector; each of the top plates is inserted into one of the grooves; for each of the grooves, two bottom plates forming the groove, the top plate inserted into the groove and an air gap within the groove form a dual-capacitor structure.

8. The infrared pixel structure according to claim 1, wherein a dielectric layer is formed on a sidewall surface of each of the bottom plates which approaches the adjacent top plate when the top plates move relative to the bottom plates.

9. A manufacturing method for the infrared pixel structure according to claim 1, comprising the following steps:
   S01, forming the lower electrode in the silicon substrate;
   S02, etching to form multiple grooves in the lower electrode, wherein a portion of the lower electrode at sidewalls of the grooves form multiple bottom plates, a portion of the lower electrode at bottoms of the grooves form the bottom connector;
   S03: forming a sacrificial layer on the silicon substrate;
   S04: forming the top plates in the sacrificial layer within the grooves, then forming the top connector connected to the top plates on a surface of the sacrificial layer;
   S05: forming the infrared sensitive structure on a surface of the top connector;
   S06: removing the sacrificial layer by a releasing process.

10. A hybrid imaging device comprising an infrared pixel structure formed on a top surface of a silicon substrate, and a visible light pixel structure formed on a bottom surface of the silicon substrate below the infrared pixel structure; wherein the infrared pixel structure comprises:
   a lower electrode disposed in the silicon substrate, the lower electrode comprises multiple bottom plates arranged in a first direction, and a bottom connector arranged in a second direction for connecting the bottom plates;
   an upper electrode disposed above the lower electrode, the upper electrode comprises multiple top plates arranged in the first direction and inter-arranged among the bottom plates, and a top connector arranged in the second direction for connecting the top plates; the top connector has a fixed end and a non-fixed end, the non-fixed end is capable of moving relative to the fixed end;

an infrared-sensitive element provided on an upper surface of the top connector, for absorbing incident infrared light and producing thermal deformation to make the non-fixed end move relative to the fixed end and produce a relative displacement between the top plates and the bottom plates, so as to change capacitive signals of the top plates and the bottom plates to achieve infrared detection.

11. The infrared pixel structure according to claim 10, wherein the bottom connector is connected to a lead end of the lower electrode; the fixed end is a connecting end which is connected to a lead end of the upper electrode, the non-fixed end is a non-connecting end which is movable relative to the connecting end; the top connector is connected to the lead end of the upper electrode through a piezoresistor.

12. The infrared pixel structure according to claim 11, wherein the piezoresistor has a planar zigzag configuration.

13. The infrared pixel structure according to claim 11, wherein the infrared pixel structure further comprises a cantilever; one end of the piezoresistor is connected to the connecting end of the top connector, the other end of the piezoresistor is connected to an end of the cantilever; the other end of the cantilever is connected to the lead end of the upper electrode.

14. The infrared pixel structure according to claim 13, wherein a horizontal projection of the cantilever is L-shaped.

15. The infrared pixel structure according to claim 10, wherein the infrared sensitive element has a material sensitive to micro stress; an increase of the micro stress occurred during a temperature rise or temperature decrease period leads to a deformation of the infrared sensitive element, which makes the top connector move relative to the connecting end and cause the relative displacement between the top plates and the bottom plates.

16. The infrared pixel structure according to claim 10, wherein the bottom connector is connected to a bottom surface of each of the bottom plates to form multiple grooves by each two adjacent bottom plates and the bottom connector; each of the top plates is inserted into one of the grooves; for each of the grooves, two bottom plates forming the groove, the top plate inserted into the groove and an air gap within the groove form a dual-capacitor structure.

17. The infrared pixel structure according to claim 10, wherein a dielectric layer is formed on a sidewall surface of each of the bottom plates which approaches the adjacent top plate when the top plates move relative to the bottom plates.

* * * * *